United States Patent [19]
Park et al.

[11] Patent Number: 5,895,943
[45] Date of Patent: Apr. 20, 1999

[54] COLOR CHARGE-COUPLED DEVICE

[75] Inventors: Chul Ho Park; Jin Seop Shim, both of Chungcheongbuk-do; Kwang Bok Song, Seoul, all of Rep. of Korea

[73] Assignee: LG Semicon Co., Ltd., Chungcheongbuk-do, Rep. of Korea

[21] Appl. No.: 08/902,957

[22] Filed: Jul. 30, 1997

Related U.S. Application Data

[62] Division of application No. 08/442,879, May 17, 1995, Pat. No. 5,677,200.

[51] Int. Cl.[6] .................... H01L 27/148; H01L 29/768
[52] U.S. Cl. ................... 257/232; 257/233; 257/432; 257/440
[58] Field of Search ................... 257/232, 233, 257/432, 440

[56] References Cited

U.S. PATENT DOCUMENTS

| | | |
|---|---|---|
| 5,321,297 | 6/1994 | Enomoto . |
| 5,444,277 | 8/1995 | Nakai et al. . |
| 5,466,612 | 11/1995 | Fuse et al. . |
| 5,534,720 | 7/1996 | Song et al. . |
| 5,605,783 | 2/1997 | Revelli et al. . |
| 5,672,519 | 9/1997 | Song et al. ........................ 437/3 |

FOREIGN PATENT DOCUMENTS

| | | |
|---|---|---|
| 60-263458 | 12/1985 | Japan . |
| 64-7562 | 1/1989 | Japan . |

*Primary Examiner*—Ngân V. Ngô

[57] ABSTRACT

A color charge-coupled device is disclosed including plural light detectors corresponding to first to third colors and plural charge transmission regions on a semiconductor substrate; a pad on one side of the substrate excluding a portion where the light detectors and charge transmission regions are formed; a planarizing film on the substrate excluding the pad; microlenses on the planarizing film above the light detectors; and first to third color filter layers on each microlens excluding the edge portion.

3 Claims, 6 Drawing Sheets

COLOR CHARGE-COUPLED DEVICE

This application is a divisional of application Ser. No. 08/442,879, filed on May 17, 1995, now U.S. Pat. No. 5,677,200.

BACKGROUND OF THE INVENTION

The present invention relates to a color charge-coupled device, and more particularly, to a color charge-coupled device and a method of manufacturing the same, which is suited to improve sensitivity and to prevent color mixing.

FIGS. 1A to 1D are cross-sectional views for illustrating a method of manufacturing a conventional color charge-coupled device.

Referring to FIG. 1A, through a general process, a plurality of photodiodes 11 for generating a signal charge according to an intensity of light incident and a plurality of vertical charge-coupled devices (VCCDS) 12, i.e., charge transmission regions for transmitting the signal charge generated from photodiodes 11, are alternatley formed on a substrate 10. A pad 13 is formed on one side of the substrate excluding a portion where the photodiodes and VCCDs are formed, thereby forming a black/white charge-coupled device.

Of photodiodes 11, reference numeral 11-1 represents a photodiode corresponding to a first color. Reference numeral 11-2 represents a photodiode corresponding to a second color. Reference numeral 11-3 represents a photodiode corresponding to a third color.

A first planarizing film 14 is formed on the entire surface of substrate 10 in which the charge-coupled device is formed.

Thereafter, a color filter layer 15 is formed on first planarizing film 14. Specifically, after forming a resin layer on first planarizing film 14, the resin layer is dyed and adhered with the first color. The colored resin layer is photo-etched, thereby forming a first color filter layer 15-1. By repeating the above process, second and third color filter layers 15-2 and 15-3 are formed on first planarizing film 14, respectively. As a result, the color filter layers of three colors are sequentially formed on first planarizing film 14, thereby completing a process of forming color filter layer 15.

After completing a process of forming color filter layer 15, a second planarizing film 16 is formed on first planarizing film 14 including color filter layer 15, thereby planarizing the substrate again.

Referring to FIG. 1B, as a material 17 for microlens, a photoresist film is coated on second planarizing film 16. By performing a photo-etching process, material 17 for microlens is patterned so as to be left only on each photodiode region 11.

Referring to FIG. 1C, patterned material 17 for microlens is thermally flowed, thereby forming convex microlenses 18 on second planarizing film 16 above each photodiode 11.

Referring to FIG. 1D, a photoresist film 19 is coated on second planarizing film 16 on which microlenses 18 are formed. Then, photoresist film 19 above pad 13 is removed through a photo-etching process, thereby exposing second planarizing film 16.

Exposed second planarizing film 16 and first planarizing film 14 placed thereunder are sequentially etched by using photoresist film 19 as a mask, thereby exposing pad 13.

Finally, after exposing pad 13, remaining photoresist film 19 is removed, thereby producing the conventional color charge coupled device.

In case that the color charge coupled device manufactured according to the above-discussed method is applied to a camera, light incident through a camera lens is converged by microlens 18, and the light converged by microlens 18 is selectively permeated through color filter layer 15. That is, among color filter layers 15, first color filter layer 15-1 selectively permeates light only for the first color, of light converged by the microlens, and applies it to photodiode 11-1 corresponding to the first, color among plurality of photodiodes 11. Second color filter layer 15-2 selectively permeates light only for the second color and applies it to photodiode 11-2 corresponding to the second color. Third color filter layer 15-3 selectively permeates light only for the third color and applies it to photodiode 11-3 corresponding to the third color.

Accordingly, light incident upon each photodiode 11 is transformed photoelectrically, thereby generating a signal charge. The charge generated from photodiode 11 is transmitted to VCCD 12 by the signal transmission operation of a general charge-coupled device, and then, transmitted to a horizontal charge-coupled device (HCCD) (not shown). After sensing the signal charge transmitted to the HCCD due to a floating diffusion from the tip of device, the signal charge is amplified through an amplifier (not shown) and then, transmitted to a peripheral circuit.

However, the method of manufacturing the conventional color coupled device involves the following problems.

First, in order to form the color filter layer according to the conventional method, a photo-etching process is performed three times. During the photo-etching process of forming the color filter layer, a photoresist film is left on an undesired portion, thereby causing color mixing. Further, light is permeated between neighboring color filter layers. This also causes color mixing.

Secondly, since the second planarizing film exists between the microlens and color filter layer, light is likely to be scattered. Further, due to the distance offset between the microlens and color filter layer, it is difficult to adjust a depth of focus to the photodiode.

Thirdly, the second planarizing film is formed after forming the color filter layer, complicating the whole process. This also consumes a great amount of a manufacturing time. The thickness of the device is increased as well.

SUMMARY OF THE INVENTION

In order to solve the aforementioned problems of the conventional method, it is an object of the present invention to provide a color charge-coupled device and a method of manufacturing the same, which is capable of not only adjusting a depth of focus easily but also preventing color mixing between neighboring color filter layers, by directly forming a color filter layer on a microlens.

It is another object of the present invention to provide a color charge-coupled device and a method of manufacturing the same, which is contrived to make a device slim by decreasing the overall thickness of the device.

It is still another object of the present invention to provide a color charge-coupled device and a method of manufacturing the same, in which a color filter layer is formed on a microlens so as to expose the edge portion of the microlens and white light is permeated through the periphery (edge portion) of the microlens, thereby improving an sensitivity.

To accomplish the object of the present invention, there is provided a color charge-coupled device comprising a semiconductor substrate; a plurality of charge transmission regions formed spaced apart by an equal distance on the semiconductor substrate; a plurality of light detectors corresponding to first to third colors and formed on the semiconductor substrate between the charge transmission regions so that the light detectors and charge transmission regions are arranged in alternate locations; a pad formed on one side of the semiconductor substrate excluding the light detectors and charge transmission regions; a planarizing film formed on the substrate excluding the pad; a plurality of microlenses formed on the planarizing film above each light detector; and first to third color filter layers corresponding to the first to third light detectors and formed directly on each microlens excluding the edge portion, respectively.

Further, there is provided a method of manufacturing a color charge-coupled device according to the present invention, comprising the steps of forming in alternate locations a plurality of light detectors corresponding to first to third colors and a plurality of charge transmission regions, on a semiconductor substrate; forming a pad on one side of the substrate excluding a portion where the light detectors and charge transmission regions are formed; forming a planarizing film on the substrate excluding an upper portion of the pad; coating a material for microlens on the planarizing film and patterning the material for microlens so as to be left only on the planarizing film above the light detectors; thermally flowing the material for microlens, to thereby form microlenses on the planarizing film above the light detectors; and performing a hard-baking process to thereby form first to third color filter layers directly on the microlenses corresponding to the light detectors of first to third colors.

BRIEF DESCRIPTION OF THE ATTACHED DRAWINGS

DETAILED DESCRIPTION OF THE INVENTION

Hereinafter, a color charge-coupled device according to preferred embodiments of the present invention will be described with reference to the attached drawings.

Figure 1A:
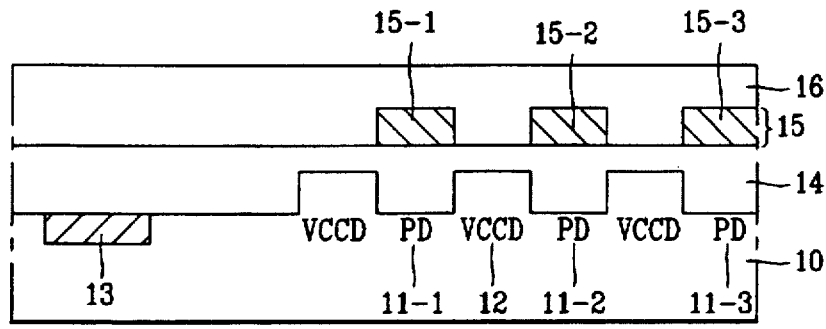
FIGS. 1A to 1D are cross-sectional views for illustrating a method of manufacturing a conventional color charge-coupled device.
Figure 1B:
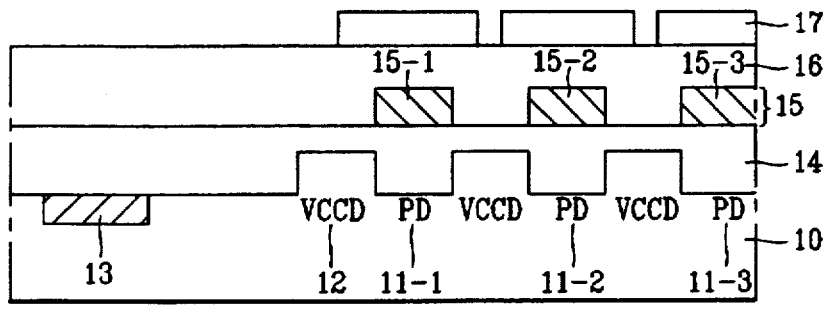
Figure 1C:
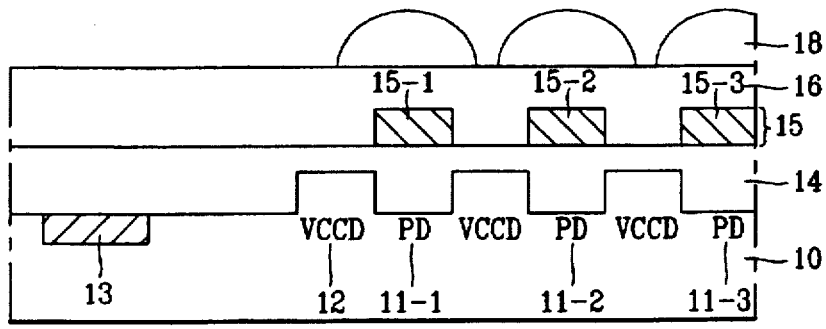
Figure 1D:
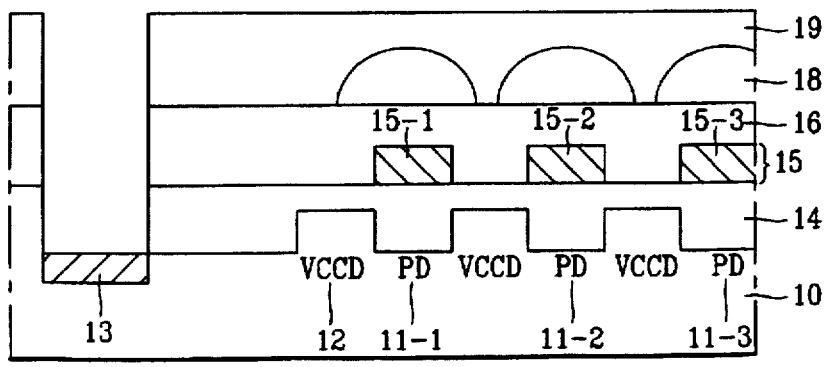
Figure 2:
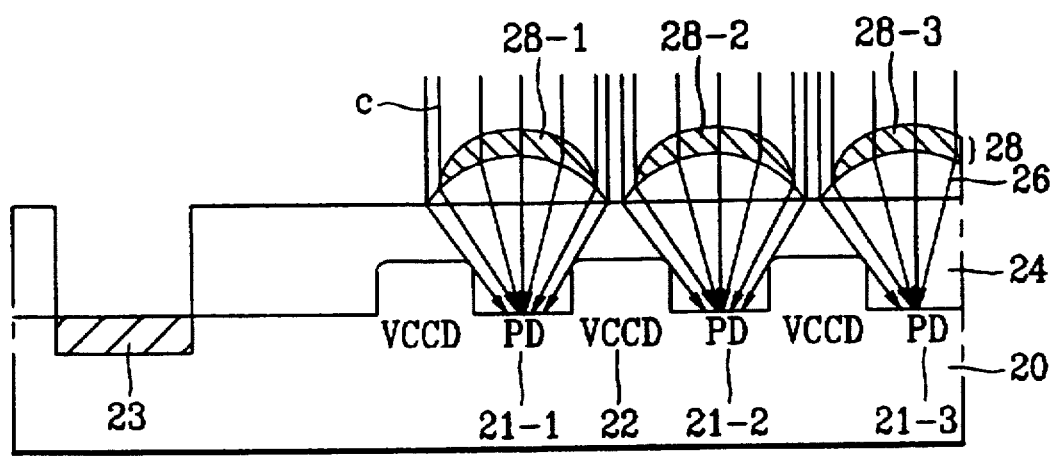
FIG. 2 is a cross-sectional view of a color charge-coupled device of the present invention.

FIG. 2 is a cross-sectional view of a color charge-coupled device according to the present invention.

Referring to FIG. 2, in the color charge-coupled device according to the present invention, a plurality of VCCDs 22 for transmitting charges are formed on a semiconductor substrate 20, being spaced apart by an equal distance. A plurality of photodiodes 21 for detecting light, corresponding to first to third colors, are formed on substrate 20 between VCCDs 22 so that photodiodes 21 and VCCDs 22 are alternately arranged. A pad 23 is formed on one side of semiconductor substrate 20 excluding photodiodes 21 and VCCDs 22. A planarizing film 24 is formed on substrate 20 excluding pad 23, and a plurality of microlenses 26 are formed on planarizing film 24 above each photodiode 21. A plurality of color filter layers 28 corresponding to the first to third colors are formed on each microlens 26 excluding its edge portion, respectively.

In the color charge-coupled device of the present invention having the aforementioned structure, color filer layers 28 corresponding to the first to third colors are formed on each microlens 26, in directly contact with the microlens. The edge portion of each microlens is exposed so as to permeate white light C.

Each color filter layer has round edge portions. Further, among plurality of color filter layers 28, a first color filter layer 28-1 is formed on microlens 26 and corresponds to a photodiode 21-1 for first color. A second color filter layer 28-2 is formed on microlens 26 and corresponds to a photodiode 21-2 for second color. A third color filter layer 28-3 is formed on microlens 26 and corresponds to a photodiode 21-3 for third color.

FIGS. 3A to 3H are cross-sectional views for illustrating a method of manufacturing a color charge-coupled device according to one embodiment of the present invention.

In the embodiment of FIG. 3, there is provided a method of manufacturing a color charge-coupled device, wherein a thermalflow process and hard-baking process are performed separately, thereby forming a color filter layer on a microlens.

Figure 3A:
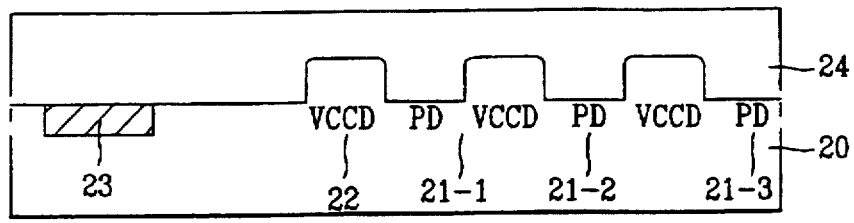
FIGS. 3A to 3H are cross-sectional views for illustrating a method of manufacturing a color charge-coupled device according to one embodiment of the present invention.

Referring to FIG. 3A, using a general process, a plurality of photodiodes 21 and a plurality of VCCDs 22 are alternatley formed on a semiconductor substrate 20. A pad 23 is formed on one side of substrate 20 excluding a portion where the photodiodes and VCCDs are formed, thereby manufacturing a black/white charge-coupled device.

Among plurality of photodiodes 21 of FIG. 3A, reference numeral 21-1 represents a photodiode corresponding to a first color. Reference numeral 21-2 represents a photodiode corresponding to a second color. Reference numeral 21-3 represents a-photodiode corresponding to a third color.

Thereafter, a planarizing film 24 is formed on the entire surface of the substrate wherein photodiodes 21, VCCDs 22, and pad 23 are formed.

Figure 3B:
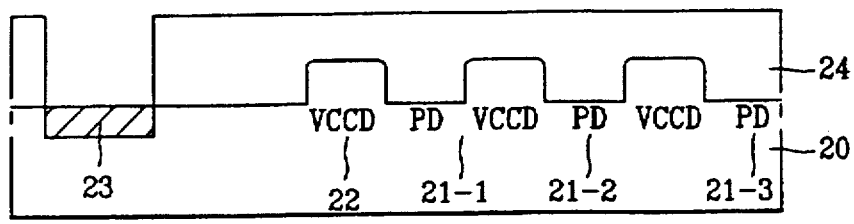

Referring to FIG. 3B, planarizing film 24 above pad 23 is removed by a photo-etching process, thereby exposing the upper surface of pad 23.

Figure 3C:
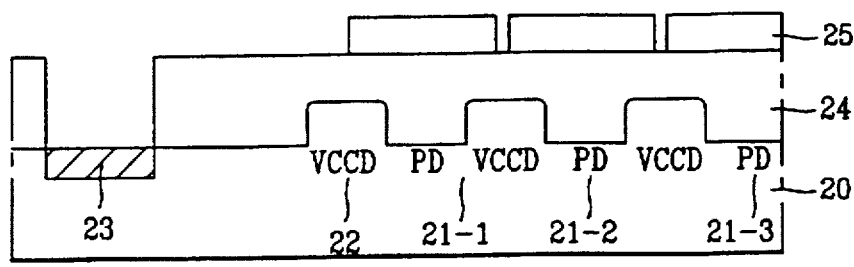

Referring to FIG. 3C, a material 25 for microlens is coated on planarizing film 24 including the upper surface of pad 23. Then, by performing a photo-etching process, material 25 for microlens is patterned so as to be left only on planarizing film 24 above respective photodiodes 21-1, 21-2 and 21-3.

Figure 3D:
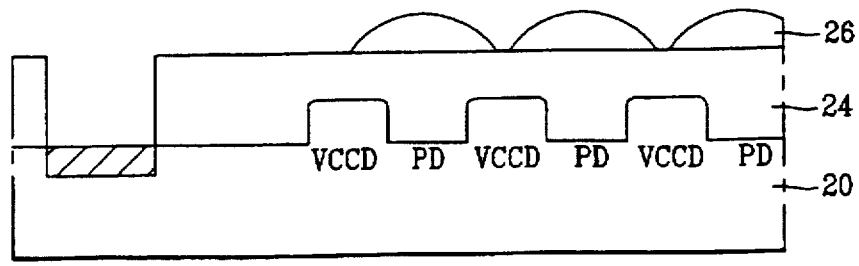

Thereafter, patterned material 25 for microlens is thermally flowed, thereby forming microlenses 26 on planarizing film 24 corresponding to each photodiode, as shown in FIG. 3D.

Figure 3E:
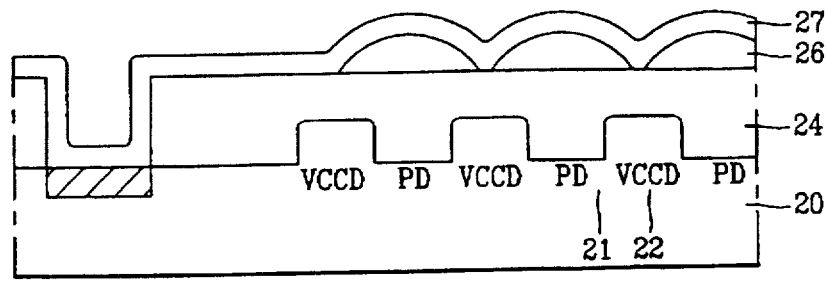

After forming microlenses 26, as shown in FIG. 3E, a first dyeing layer 27 is coated over the entire surface of the substrate. Then, according to a general dyeing process, first dyeing layer 27 is dyed and adhered with the first color.

Figure 3F:
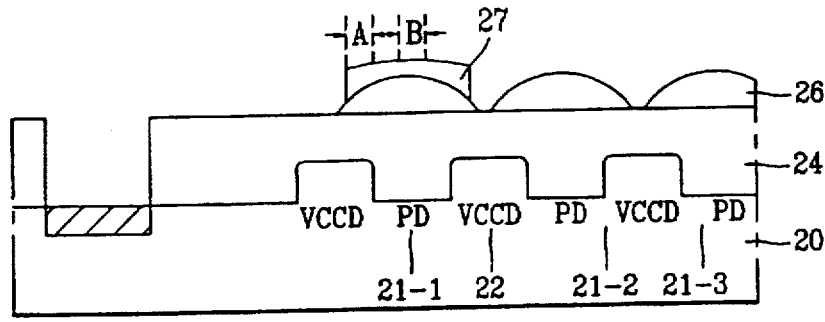

Then, after performing a dyeing process as shown in FIG. 3F, colored first dyeing layer 27 is patterned. Here, among plurality of photodiodes 21, the first dyeing layer is left only on microlens 26 located above photodiode 21-1 corresponding to the first color, and the other first dyeing layer all is removed.

At this time, as shown in FIG. 3F, first dyeing layer 26 left on photodiode 21-1 corresponding to the first color is formed so as not to surround the entire microlens 26, but to expose the edge portion of microlens 26.

Further, since first dyeing layer 27 is coated by a spin-coat method in FIG. 3E, first dyeing layer 27 is coated such that it becomes thicker in the valley portion between the microlenses rather than in the center portion of microlenses 26. As in FIG. 3F if first dyeing layer 27 is patterned, first dyeing layer 27 is formed such that it becomes thicker in the center portion C rather than in the center portion B.

Figure 3G:
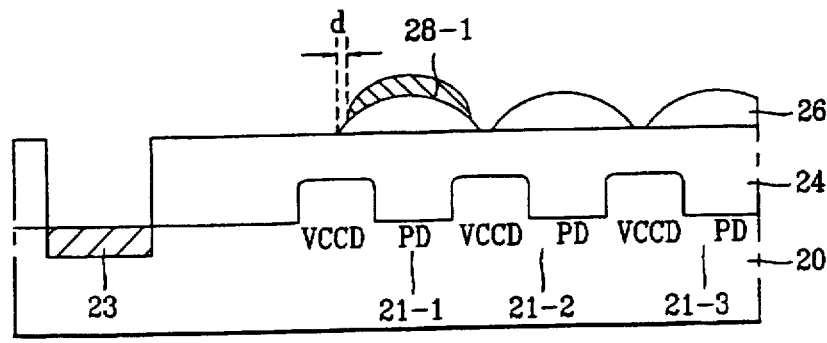

After patterning first dyeing layer 27, a hard-baking process is performed, thereby forming a first color filter layer 28-1 as shown in FIG. 3G.

When performing the hard-baking process, both thick edge portions of first dyeing layer 27 are flowed more, so that first color filter layer 28-1 is formed in a round shape so as to expose the edge portion of microlens 26 by a predetermined distance d.

Forming the first color filter layer in order to expose the edge portion of microlens 26 by a predetermined distance is done because white light must be permeated through the above portion.

Figure 3H:
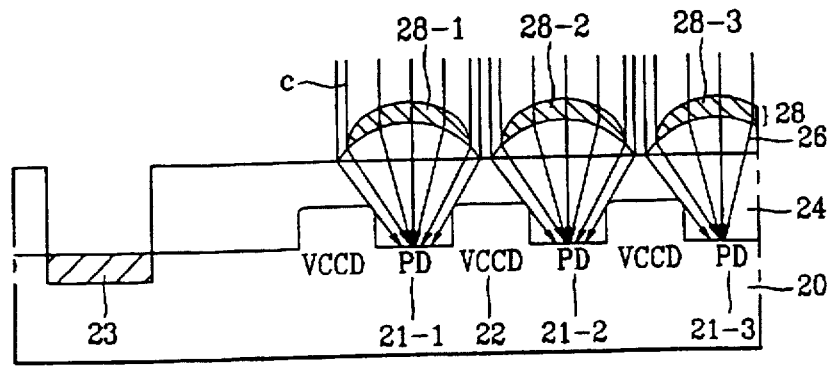

After forming first color filter layer 28-1, a second dyeing layer is coated over the entire surface of the substrate in the same method as that of forming first color filter layer 28-1. The second dyeing layer is dyed and adhered with the second color. Then, the second dyeing layer is patterned so as to be left only on photodiode 21-2 corresponding to the second color among plurality of photodiodes 21. Next, the patterned second dyeing layer is hard-baked, thereby forming a second color filter layer 28-2, as shown in FIG. 3H. Thereafter, according to the method as described above, a third color filter layer 28-3 is formed on microlens 26, thereby forming color filter 28. As a result, a color charge-coupled device is obtained according to the embodiment of the present invention.

In the above color charge-coupled device, it is possible to prevent color mixing since color filter layer 28 is directly formed on microlens 26. Further, since no color filter layer is formed on the edge portion of microlens 26 white light C is permeated through the edge portion of microlens 26 such that the sensitivity of color charge-coupled device can be improved.

FIGS. 4A to 4G are cross-sectional views for illustrating a method of manufacturing a color charge-coupled device according to another embodiment of the present invention.

In this embodiment of FIG. 4, there is provided a method of manufacturing a color charge-coupled device, wherein a thermalflow process and hard-baking process are performed at the same time, thereby forming a color filter layer on a microlens.

Figure 4A:
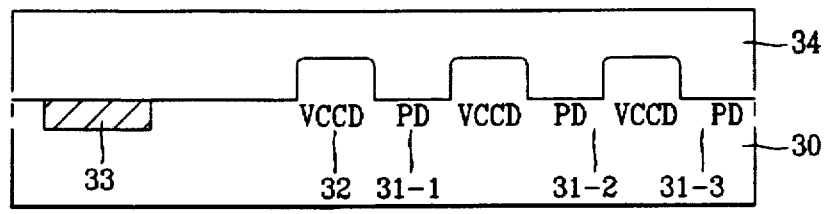
FIGS. 4A to 4G are cross-sectional views for illustrating a method of manufacturing a color charge-coupled device according to another embodiment of the present invention.

Referring to FIG. 4A, as in the above embodiment, a plurality of photodiodes 31 and a plurality of VCCDs 32 are formed by turns on a semiconductor substrate 30. A pad 33 is formed on one side of substrate 30, and then, a planarizing film 34 is formed over the entire surface of the substrate. Photodiodes 31 are comprised of a photodiode 31-1 corresponding to a first color, a photodiode 31-2 corresponding to a second color, and a photodiode 31-3 corresponding to a third color.

Figure 4B:
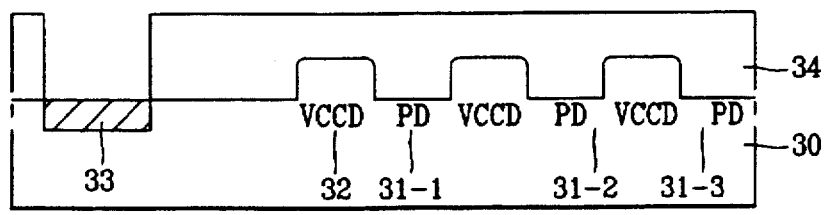

As shown in FIG. 4B, planarizing film 34 above pad 33 is removed by a photo-etching process, thereby exposing the upper surface of pad 33.

Figure 4C:
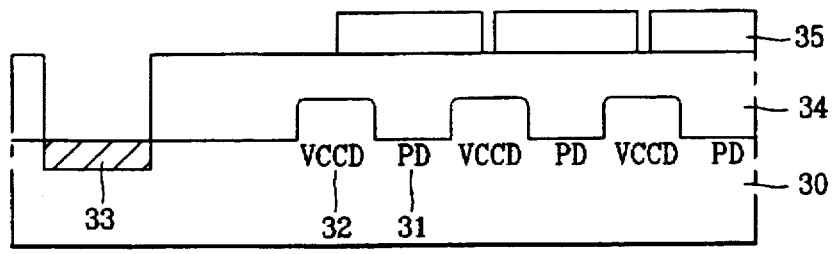

As shown in FIG. 4C, a material 35 for microlens is coated on planarizing film 34 including the upper surface of pad 33. Then, by performing a photo-etching process, material 35 for microlens is patterned so as to be left only on planarizing film 34 above each photodiode 31.

Figure 4D:
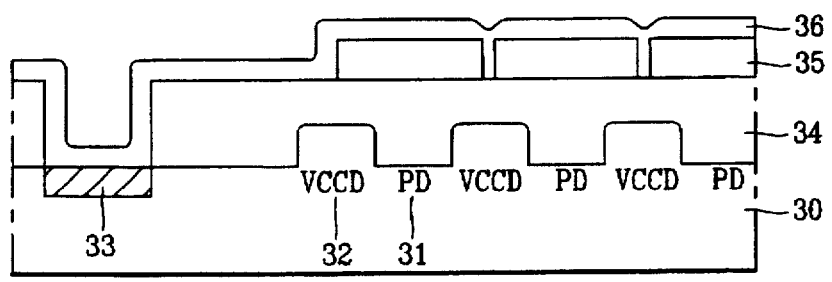

As shown in FIG. 4D, a first dyeing layer 36 is coated on substrate 30 including material 35 for microlens. Then, according to a general dyeing process, first dyeing layer 36 is dyed and adhered with the first color.

Figure 4E:
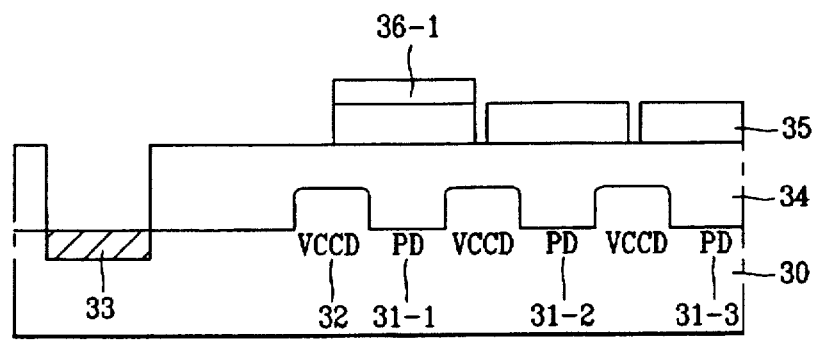

After performing the dyeing process as shown in FIG. 4E, colored first dyeing layer 36 is patterned by performing a photoetching process, thereby leaving first dyeing layer 36-1 only on photodiode 31-1 corresponding to the first color among a plurality of photodiodes 31.

Figure 4F:
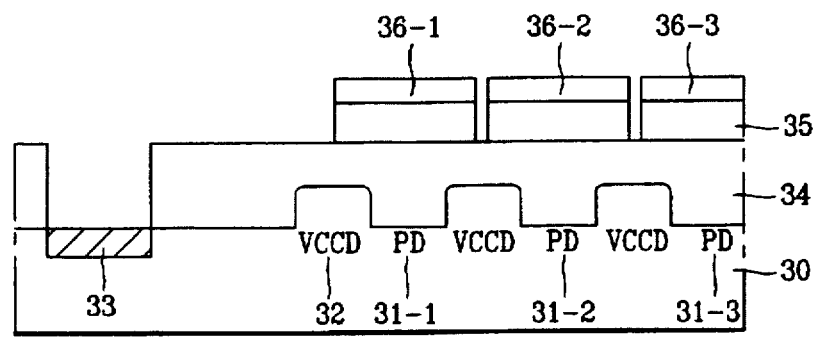

By performing the processes of FIGS. 4D and 4E, as shown in FIG. 4F, second and third dyeing layers 36-2 and 36-3 are formed on planarizing film 34 over photodiodes 31-2 and 31-3 corresponding to the second and third colors among a plurality of photodiodes 31, respectively. That is, after coating a second dyeing layer on the entire surface of the substrate, the coated second dyeing layer is dyed and adhered. Then, second dyeing layer 36-2 is patterned so as to be left only on photodiode 31-2 corresponding to the second color.

Then, after coating a third dyeing layer on the entire surface of the substrate, the coated third dyeing layer is dyed and adhered with the third color. Next, the third dyeing layer colored with the third color is patterned, thereby forming third dyeing layer 36-3 only on photodiode 31-3 corresponding to the third color.

After forming the dyeing layer, material 35 for microlens and first to third dyeing layers 36-1, 36-2 and 36-3 formed thereon are thermally flowed at the same time. Then, they are hard-baked, simultaneously.

Accordingly, material 35 for microlens is flowed, thereby forming microlenses 37 on planarizing film 34 corresponding to photodiodes 31. First to third color filter layers 38-1, 38-2 and 38-3 are formed on microlenses 37. As a result, color filter 38 is formed on microlens 37, thereby obtaining a color charge-coupled device according to the second embodiment.

Figure 4G:
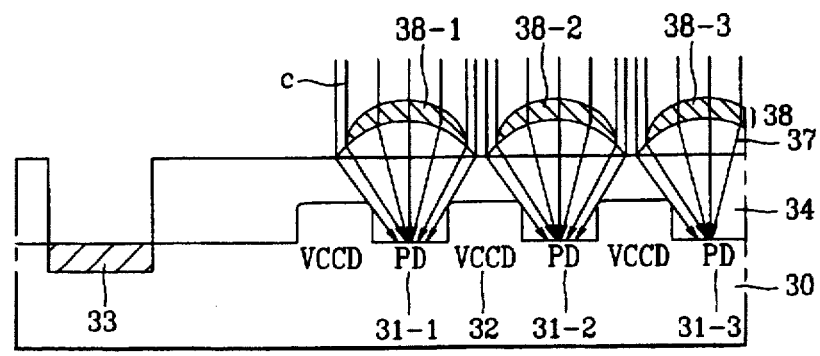

Referring to FIG. 4G, color filter layers 38-1, 38-2 and 38-3 are directly formed on microlenses 37 so as to expose the edge portion of microlens 37 by a predetermined distance d.

In the case that the microlens material 35 and dyeing layer 36 are thermally flowed at the same time, each color filter layer is formed so as to expose the edge portion of microlens 37, as in the above embodiment. The reason for doing it is that the degree of thermal-flowing of each dyeing layer 36 is lower than that of thermal-flowing of material 35 for microlens.

In the above two embodiments, for forming the color filter layer, the dyeing layer is coated, and the coated dyeing layer is dyed and adhered with the corresponding color. However, in the case that color layers containing the first to third colors are used, since the colors are contained within the color layers themselves, the color filter layers can be formed by performing only photo-etching process, without performing a dyeing and adhering process.

According to the present invention as describe above, the following effects can be obtained.

First, after forming microlenses, color filter layers are formed thereon, thereby preventing color mixing between neighboring color filter layers. Further, the color filter layers are formed on the microlenses so as to-expose the edge portion of the microlenses, so that white light is permeated through the exposed microlense. Thus, the sensitivity of color charge-coupled device can be improved.

Secondly, a pad is exposed at the beginning of process, so that an etching process of exposing the pad and a process of removing remaining photoresist are omitted at the end of process. This prevents the generation of particles and prevents a device from being damaged due to the generation of particles. Further, the pad is exposed through one photo-etching process using a single planarizing film, so that the conventional complicated process of exposing the pad is omitted. This simplifies the process.

What is claimed is:

1. A color charge-coupled device comprising:

a semiconductor substrate;

a plurality of charge transmission regions formed on said semiconductor substrate;

a plurality of light detectors, corresponding to first, second and third colors, formed on said semiconductor substrate wherein said light detectors and said charge transmission regions are alternately arranged;

a pad formed on one side of said semiconductor substrate where no said light detectors and no said charge transmission regions are formed;

a planarizing film formed on said substrate, said light detectors and said charge transmission regions;

a plurality of microlenses formed on said planarizing film above said light detectors; and first to third color filter layers formed on said microlenses over corresponding ones of said light detectors, respectively.

2. The device of claim 1, wherein said microlenses are incompletely covered by said first to third color filter layers, respectively, such that a predetermined amount of unfiltered light passes through said microlenses.

3. The device of claim 2, wherein edge portions of said microlenses remain uncovered by said first to third color filter layers, respectively.

* * * * *